United States Patent [19]
Sirieix

[11] Patent Number: 4,583,108
[45] Date of Patent: Apr. 15, 1986

[54] IMAGE RECORDING AND READING APPARATUS

[75] Inventor: Michel B. Sirieix, Jouy en Josas, France

[73] Assignee: Societe Anonyme de Telecommunications, Paris, France

[21] Appl. No.: 704,893

[22] Filed: Feb. 22, 1985

Related U.S. Application Data

[63] Continuation of Ser. No. 446,271, Dec. 2, 1982.

[30] Foreign Application Priority Data

Dec. 7, 1981 [FR] France .................... 81 22837

[51] Int. Cl.$^4$ ........................... H01L 27/14
[52] U.S. Cl. ...................... 357/30; 357/31; 357/32; 357/45; 357/52; 357/54; 357/68; 357/71
[58] Field of Search ............ 357/31, 32, 45, 30 G, 357/30 H, 30, 68, 71, 54, 52, 23.5, 44, 17

[56] References Cited

U.S. PATENT DOCUMENTS

| | | | |
|---|---|---|---|
| 3,543,031 | 11/1970 | Kazan et al. | 357/31 X |
| 4,200,892 | 4/1980 | Weimar | 357/44 X |
| 4,242,706 | 12/1980 | McCormack et al. | 357/32 X |
| 4,288,702 | 9/1981 | Ozawa et al. | 357/32 X |
| 4,331,968 | 5/1982 | Gosney, Jr. et al. | 357/54 X |
| 4,355,375 | 10/1982 | Arakawa | 357/23.5 X |
| 4,369,513 | 1/1983 | Umeda et al. | 357/17 X |

FOREIGN PATENT DOCUMENTS 8001643 12/1980 PCT Int'l Appl. .................... 357/31

OTHER PUBLICATIONS

Brown et al, "Transparent Metal Oxide Electrode CID Imager," *IEEE Jour. of Solid-State Circuits*, vol. SC-11, No. 1, Feb. 75, pp. 128-132.

van Santen, "Invited: Solid State Image Sensors Using the Charge Transfer Principle," *Jap. Jour. of Applied Phys.*, vol. 16, Supp. 16-1, 365-371.

Arellano, "High-Resolution, Self-Scanning Line Imager," *IBM, Technical Disclosure Bulletin*, vol. 18, No. 7, Dec. 1975, 2278-2279.

Kim, "InSb Charge-Injection Device Imaging Array," *IEEE Trans. Electron. Devices*, vol. ED-25, No. 2, 2/1978, 232-240.

Chamberlain et al, "Spectral Response Limitation Mechanisms of a Shallow Junction $N\pm P$ Photodiode," *IEE Trans. Electron. Devices*, vol. ED-25, No. 2, p. 24.

*Primary Examiner*—Andrew J. James
*Assistant Examiner*—William Mintel
*Attorney, Agent, or Firm*—Frishauf, Holtz, Goodman & Woodward

[57] ABSTRACT

The elementary memory cells of an image recording and readout apparatus are disposed in a staggered arrangement on a semiconductor substrate 61, each cell comprising a central transparent conducting electrode 66 connected to a column conductor 67 and a peripheral transparent conducting electrode 69 connected to a row conductor 70. Conducting guard electrodes 71 are disposed in subjacent relationship to the row and column conductors.

13 Claims, 21 Drawing Figures

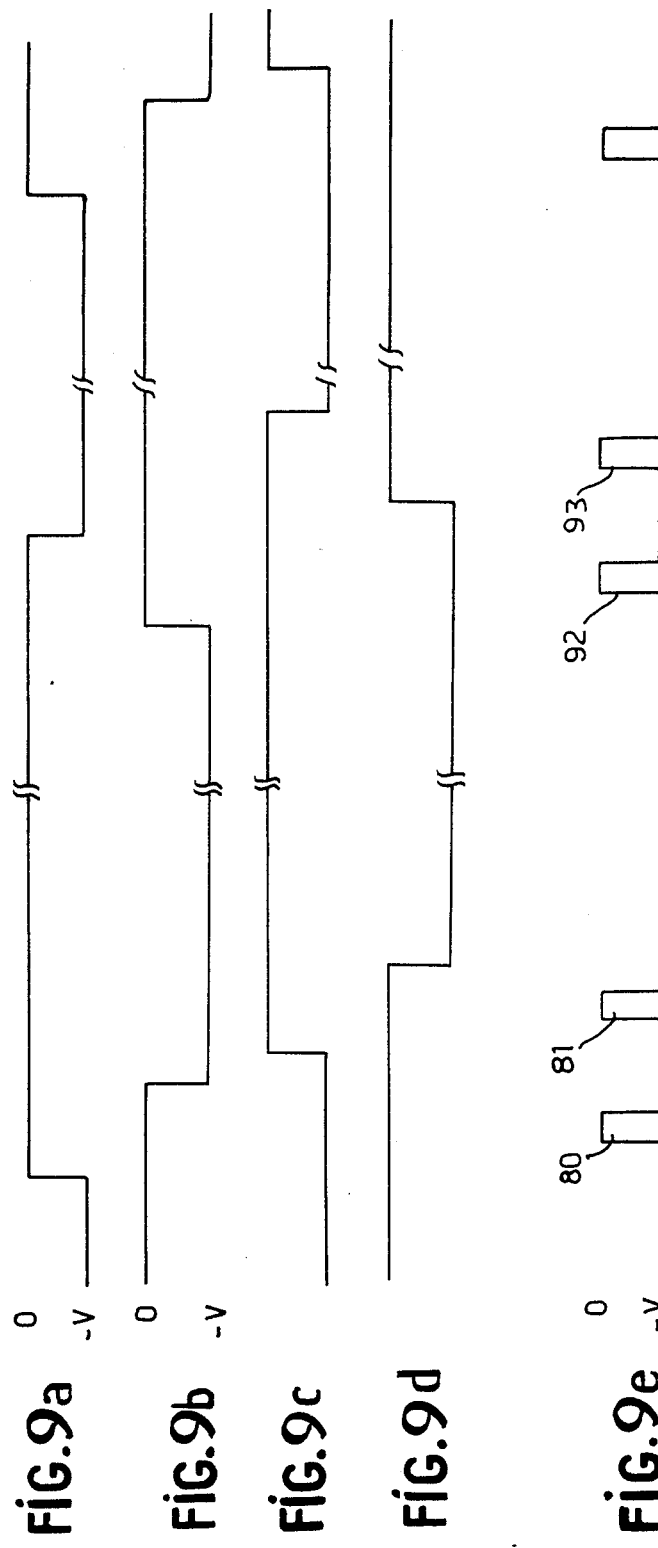

IMAGE RECORDING AND READING APPARATUS

This application is a continuation of application Ser. No. 446,271, filed Dec. 2, 1982.

The present invention concerns image recording and readout apparatus and more particularly apparatus for recording images produced in the infra-red range and reading out such images.

BACKGROUND OF THE INVENTION

Among apparatus for recording and readout infra-red radiation images, it is known to use solid-state apparatus which primarily comprises a semiconductor substrate, for example of type N, which is covered on one side by a thin insulating layer and on the other side by a conducting metal layer. Transparent metal electrodes are regularly disposed on the insulating layer, for example in the form of a matrix comprising rows and forming columns and, with the insulating layer and the underlying semiconductor material, a corresponding number of elementary sensors or cells for sensing infra-red radiation which is directed onto the electrodes by means of a suitable optical device. Each of the electrodes and the metal layer of the substrate comprises an ohmic contact which permits electrical voltages to be applied thereto. By using suitable electrical voltages, it is possible to create, in the semiconductor, under the insulation of each of the transparent electrodes, a region of very small thickness, in which the free carriers are less numerous than in the rest of the semiconductor member. That "depopulated" region can then receive charges which are generated by the absorption of photons received by way of the transparent electrodes. The amount of charge which is accumulated in the above-indicated manner is then directly related to the amount of radiation received by way of the electrode. Changing the voltages applied to the contacts of the transparent electrodes and the metal layer of the substrate makes it possible to suppress the depopulated regions, giving rise to a discharge current which flows between the electrode and the metal layer of the substrate. By measuring that current, it is possible to determine the amount of accumulated electric charge and therefore the amount of infra-red radiation received.

In solid-state apparatus of the above-described type, the dimensions of each transparent electrode which corresponds to an elementary cell or an elementary sensor are of the order of 50 microns, and a large number of elementary cells therefore have to be grouped and assembled together in order to produce a screen and an image, or suitable dimensions. However, the number of cells is limited which can be grouped together and assembled, for example in the form of a matrix comprising rows and columns.

In fact, when considering a screen comprising 1024 cells and formed by a 32×32 matrix with a row and column pitch of 50 microns, the recording time would be a millisecond, in the case of infra-red radiation, which would mean that the reading time would be about one microsecond per cell, which is impossible to achieve at the present time.

It has therefore been proposed that the cells should be grouped for the reading operations, and that each group of cells should be read sequentially. Thus, in a 32×32 matrix, the 32 cells in a row are read simultaneously by applying an electrical signal thereto, by way of a row conductor which is connected to all the cells in a row; the readout signals appear on the 32 column conductors, each column conductor being connected to the cell of a column. That lay-out is satisfactory when the number of cells connected to the same column conductor is between 32 and 64. In fact, on the one hand, each column conductor has one of its ends connected to an amplifier. The pass band and therefore the noise of the amplifiers increases in proportion to the frequency of the signals read. The signal frequency will increase in proportion to an increase in the number of cells in a column. On the other hand, the signal of each elementary cell of a column, which will be applied to the amplifier, will decrease in strength in proportion to an increase in the number of cells in a column, as a result of the attenuating effect due to the capacitances of the cells of the column which are not selected for the reading operation. Those two phenomena act in opposition to each other, in dependence on the number of cells in a column, determining a number of cells, above which the signal read is weaker than the noise of the amplifier and cannot therefore be detected. At the present time, that number is from 32 to 64, depending on the matrices produced and the characteristics of the amplifier.

The above-described matrix lay-out, involving grouping cells in a row, also suffers from a limitation in regard to the number of cells in a row, due to the distributed time constant of the elementary cells, which limits the time for access to a cell. However, that limitation is less than that due to the number of cells in a column.

Due to the above-mentioned limitations, it is not possible to produce apparatus for recording and reading out images in the infrared spectrum, which would give images in a television format, for example on 625 lines, in such a way that the infra-red image can be transferred onto a television screen by line scanning. In fact, in order to carry out such a transfer operation, the apparatus for recording and reading images in the infra-red spectrum would have to comprise 625 elementary cells per column, whereas the abovementioned limitation is between 32 and 64.

SUMMARY OF THE INVENTION

The object of the present invention is therefore to provide apparatus for recording and reading out images in the infra-red spectrum, which permit television format type images to be produced.

The present invention therefore concerns an apparatus for recording and reading out images in the infra-red range, which comprises a substrate of semiconductor material, having two opposite parallel main faces. A conducting layer covers one of the two opposite main faces. A first insulating layer covers the entire surface of the other main face. The apparatus also has a first plurality of electrodes of transparent conducting material, a second insulating layer covering the first plurality of transparent conducting electrodes, and a second plurality of electrodes of transparent conducting material. Each electrode of the second plurality is associated with an electrode of the first plurality. There is also a third insulating layer covering the transparent conducting electrodes of the second plurality. Finally, there are connecting conductors connecting each of the groups of electrodes of the first plurality to a reading amplifier and connecting conductors connecting each of the groups of electrodes of the second plurality to an addressing circuit.

In order to increase the number of elementary cells which can be grouped on the same substrate, without thereby increasing the number of cells connected to a connecting conductor connected to an amplifier, it is proposed that the elementary cells are to be arranged in a staggered formation, and that means are to be provided to prevent the disturbances due to the currents flowing in the connecting conductors, which means may comprise conducting guard electrodes which are subjacent to said connecting conductors or insulating regions which are diffused into the semiconductor substrate and which are subjacent to the connecting conductors.

It is also possible to increase the number of elementary cells, by electrically dividing into two, each electrode of the plurality which is connected to the addressing register.

BRIEF DESCRIPTION OF THE DRAWINGS

The present invention will be better appreciated from the following description of particular embodiments, with reference to the accompanying drawings in which.

DESCRIPTION OF THE PREFERRED EMBODIMENTS

Figure 1:
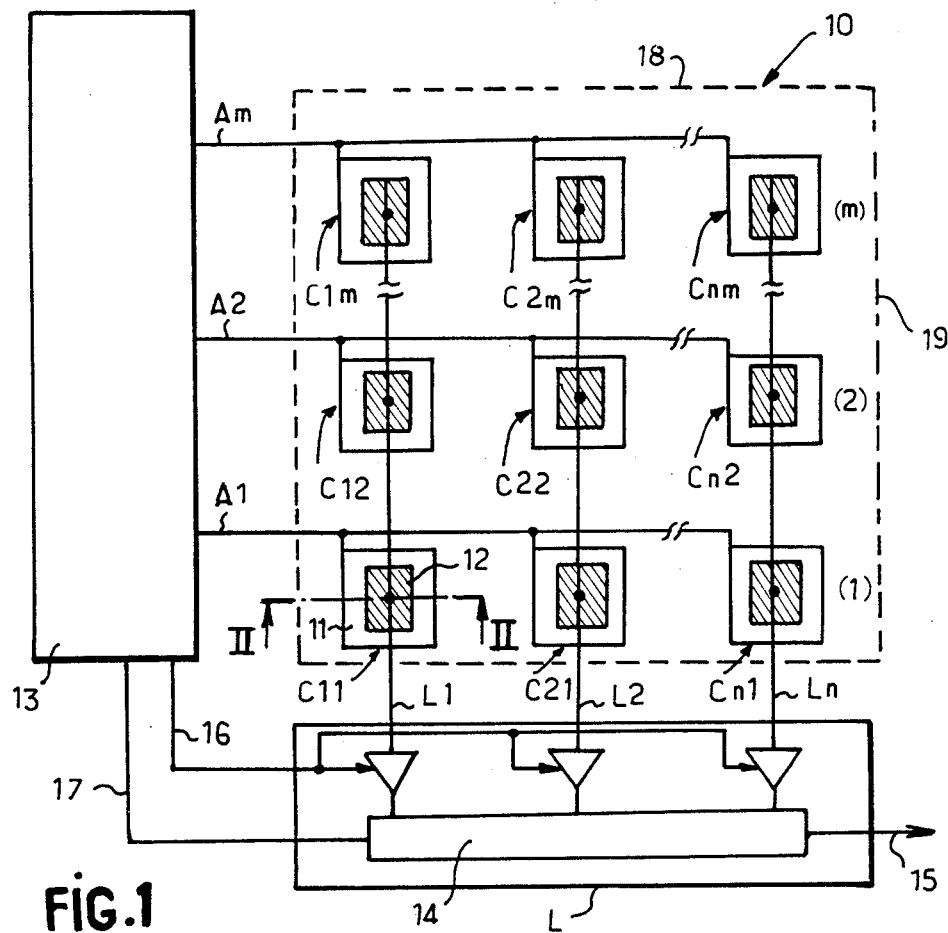
FIG. 1 is a highly simplified diagrammatic view on an enlarged scale of an apparatus for recording and reading out images in the infra-red spectrum.

FIG. 1 is a highly simplified diagrammatic electrical representation on an enlarged scale of an apparatus for recording and reading images in the infra-red range, showing a matrix 10 comprising m rows numbered from 1 to m, and n columns numbered from 1 to n, so as to define m×n elementary cells. FIG. 1 shows only nine cells, as indicated by references C11, C12, C1m, C21, C22, C2m, Cn1, Cn2 and Cnm. As will be described with reference to FIG. 2, each cell comprises an addressing electrode such as that indicated at 11, and a reading electrode such as that indicated at 12. The n addressing electrodes of a row are connected to an addressing conductor indicated at A1 in respect of the row 1, A2 in respect of the row 2 and Am in respect of the row m, the m addressing conductors forming the output conductors of an addressing register 13. The m reading electrodes of a column are connected to a reading conductor indicated at L1 in respect of column 1, L2 in respect of column 2 and Ln in respect of column n, and each reading conductor is connected to the input of a reading amplifier indicated at AL1 in respect of the column 1, AL2 in respect of the column 2 and ALn in respect of the column n. The outputs of the n amplifiers AL1 to ALn are connected to a multiplexing circuit 14, the output signal of which appears on the conductor 15. It should be noted that each amplifier Al1 to ALn comprises at its input a sampling circuit, of the "sample-and hold" type for example, which samples the signal that is read on the cell of the column which was addressed. In order to perform the sampling operation and also the above-mentioned multiplexing operation, the amplifiers and the multiplexing circuit receive signals from the register 13 by way of electrical connecting means indicated at 16 in the case of sampling operation and 17 in the case of multiplexing operation.

Figure 2:
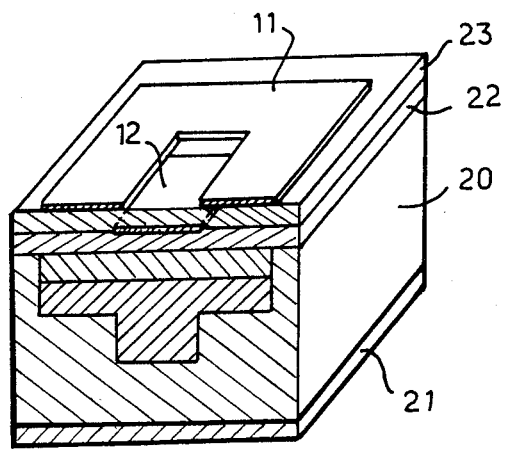
FIG. 2 is a view on an enlarged scale, partly in section taken along line 2—2 in FIG. 1 and partly in perspective, of the cell C11 of the apparatus shown in FIG. 1.

FIG. 2 is a view, partly in section and partly perspective, of a part of the cell C11 of the matrix 10, the cross-section being taken along line 2—2. The matrix 10 is in the form of a plate formed by a semiconductor substrate 20, for example of type N. FIG. 2 shows only the volume of semiconductor substrate which is underneath the electrodes of the elementary cell C11. The bottom surface of the semiconductor substrate 20 is covered by a conducting metal layer 21, for example of gold, which acts as a reference electrode in respect of the voltages applied to the other electrodes which will be described hereinafter. The top surface of the semiconductor substrate 20 is entirely covered by a first layer 22 of insulating material, for example silica. The reading electrode 12 comprises metal, for example nickel chromium, and is deposited in the form of a thin transparent layer. The reading electrode is connected to the reading conductor L1, for example of chromium-gold, which is deposited on the thin insulating layer 22. The electrode 12 as well as the insulating layer 22 are covered by a second insulating layer 23, for example of silica, so that the addressing electrode 11 which is a thin transparent metal layer, for example of nickel-chromium, can be deposited around the reading electrode 12, but without contact therewith. The addressing electrode 11 is connected to the addressing conductor A1, for example comprising chromium-gold, which is deposited on the insulating layer 23. The assembly formed by the addressing electrode 11, the addressing conductor A1 and the subjacent insulating layer 23 is covered by a third insulating layer, for example of silica, which is not shown in FIG. 2.

By way of indication, the thicknesses of the various components described above are as follows:
500 microns to 1000 microns for the substrate;
300 Angstroms to 1000 Angstroms for the metal layer 21;
700 Angstroms to 1500 Angstroms for the various insulating layers;
100 Angstroms to 300 Angstroms for the addressing electrode and the reading electrode; and
300 Angstroms to 500 Angstroms for the conductors.

Also by way of indication, the dimensions of the electrodes and the conductors are as follows:
20 microns along a side, for a reading electrode in the form of a square;
40 microns along an outside edge, of an addressing electrode; and
5 microns for the conductors.

The dimensions of the electrodes as indicated above may vary according to their respective position with respect to the substrate, bearing in mind that the surface area of the electrode decreases in proportion to decreasing distance from the substrate. Thus, the area of the addressing electrode which, in the described embodiment, is three times that of the reading electrode, could be equal to or even less than that of the reading electrode if it were disposed either at the same level as or at a lower level than the reading electrode.

FIGS. 3a to 3i are diagrams showing signals at different points in the recording and reading apparatus shown in FIG. 1. Thus, FIGS. 3a to 3c are diagrams in respect of the addressing signals applied to the addressing electrodes of the rows A1, A2 and Am. FIG. 3d shows the signals which are applied to a column, for example the column L1. FIG. 3e shows the signals which appear at the input of the amplifier AL1, before the sampling operation. FIGS. 3f and 3g show the signals for controlling the sampling-blocking means disposed at the input of the amplifier AL1. FIG. 3h shows the signals which appear at the output of the sampling-blocking means, before amplification. Finally, FIG. 3i shows the signals which appear on the output conductor 15 of the multiplexing circuit 14, the part of the signal during the duration of the pulse of the signal of FIG. 3a corresponding to the signals which are read at the different cells in the row A1. It will be appreciated that the reading process permits sequential reading of the different cells in a row, for example row A1, followed then by reading of the corresponding cells in the following row, for example A2, and so on, that is to say, reading is effected row by row, or line by line, similarly to television screen field reading.

As mentioned above, an account of certain phenomena the number m of elementary cells which can be connected to the same reading conductor is limited, and at the present time the number m cannot exceed 64. When using elementary cells connected to the same addressing conductor, that limitation is less, severe and the number n may attain and exceed 100.

With such limitations, it is possible to produce only apparatus comprising not more than 64 rows and 100 columns, whereas in order to produce a television picture format, a minimum of 256 rows and 400 columns would be required.

Therefore, in order to arrive at that image format, or at least a similar format, it is proposed that the elementary cells or the matrices of elementary cells be grouped in different ways.

Figure 4:
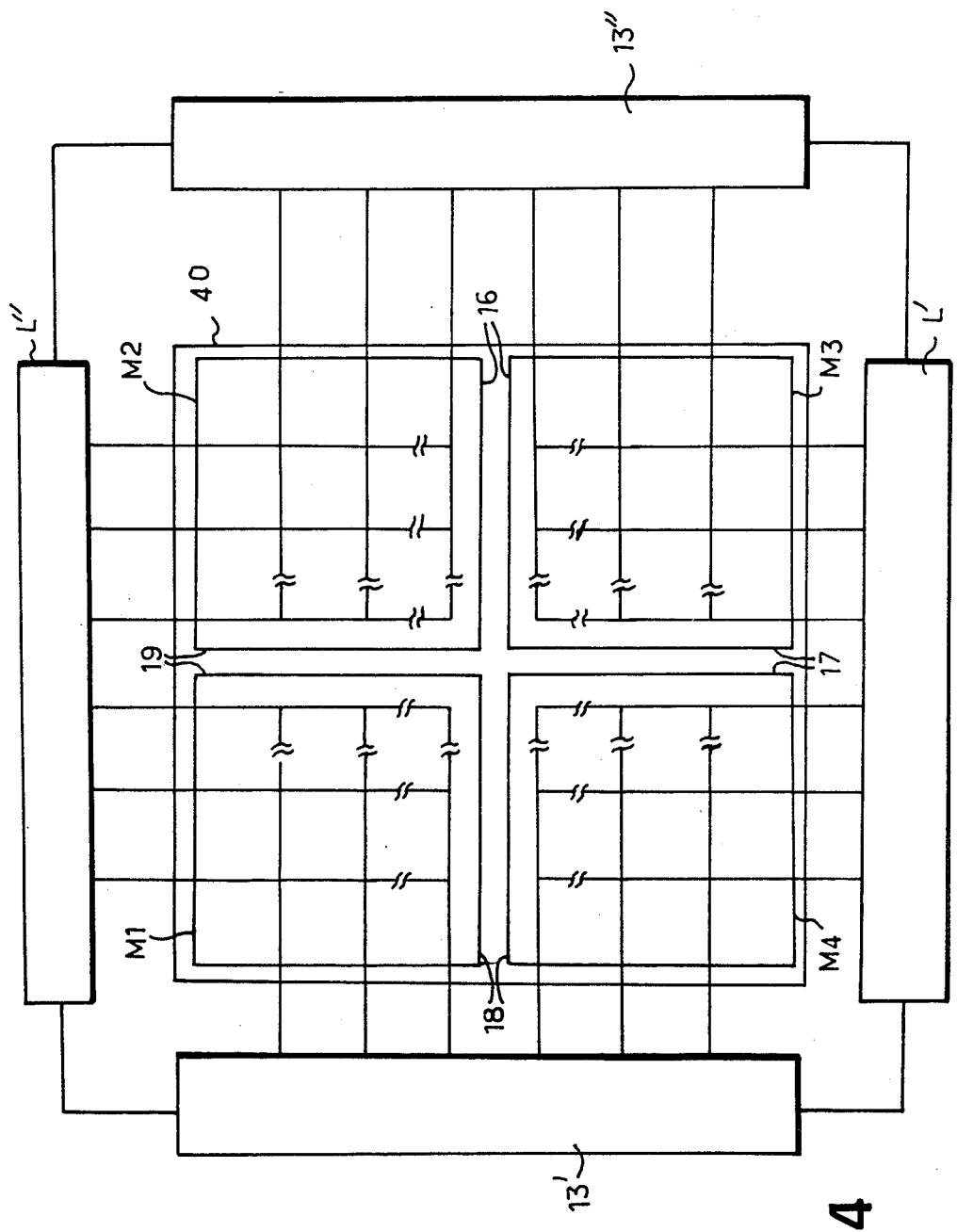
FIG. 4 is an apparatus for recording and reading out images in the infra-red spectrum, resulting from grouping four units of apparatus similar to that described with reference to FIG. 1, on the same carrier.

Thus, referring to FIG. 4, four elementary matrices, each of which is similar to the matrix 10 in FIG. 1, are grouped in accordance with the present invention on the same carrier 40 in such a way that the sides 18 and 19 of an elementary matrix, for example the matrix M1, are respectively disposed facing the similar sides 18 and 19 of two adjacent matrices M4 and M2.

The row conductors of the matrices M1 and M4 are connected to an addressing circuit 13' while the row conductors of the matrices M2 and M3 are connected to an addressing circuit 13", the registers 13' and 13" being similar to the addressing circuit 13 shown in FIG. 1. The column conductors, that is to say, the reading conductors, of the matrices M1 and M2 are connected to the reading circuit L" while the reading conductors of the matrices M3 and M4 are connected to a reading circuit L', the reading circuits being similar to the reading circuit L shown in FIG. 1 and each comprising a sampling and amplification circuit for each column, and a multiplexing circuit, sid circuits being controlled by signals from the addressing circuits 13' and 13".

Such an arrangement makes it possible for example to produce a matrix comprising 128 rows and 200 columns.

Figure 5:
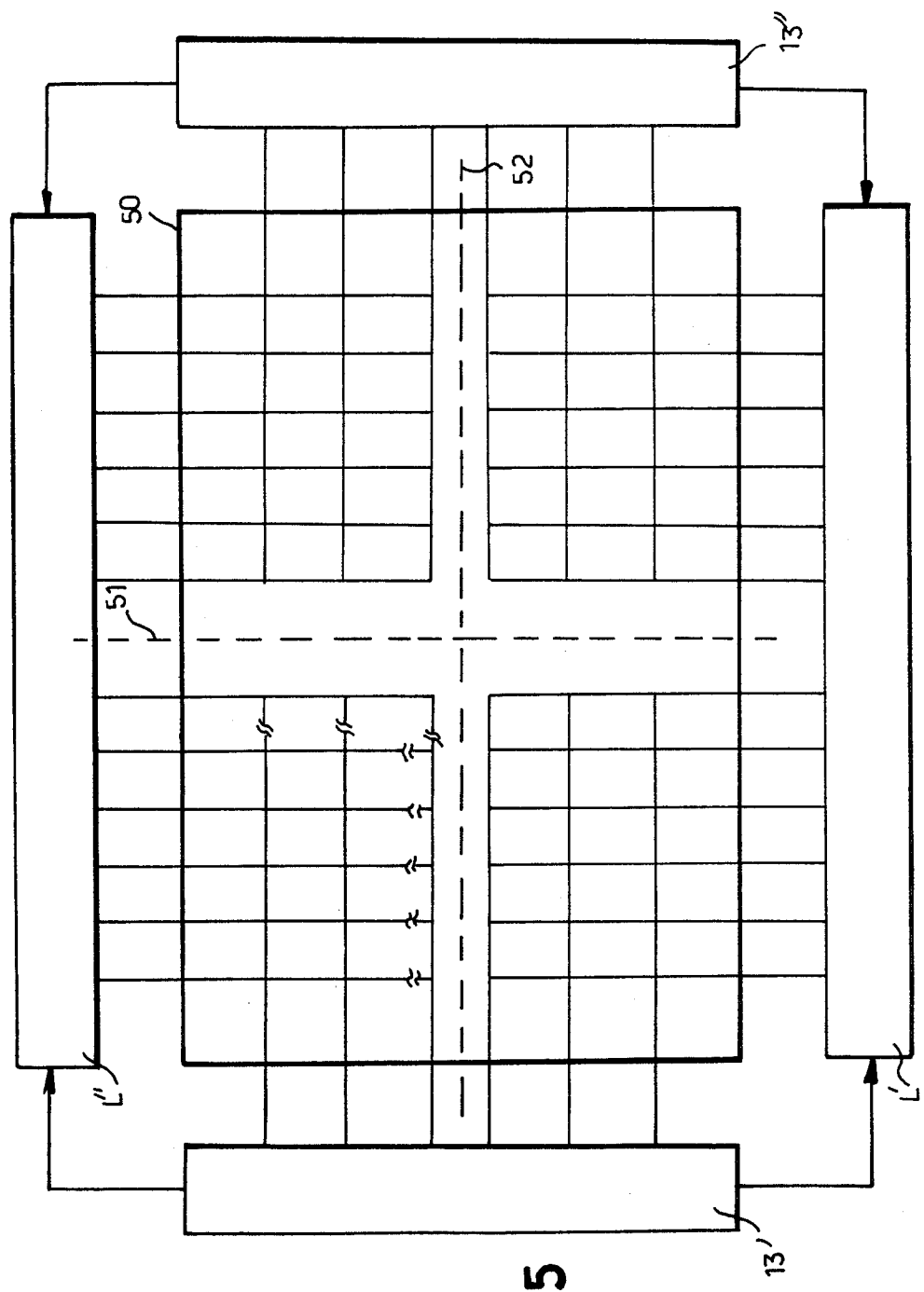
FIG. 5 is an apparatus for recording and reading images in the infra-red spectrum, resulting from grouping four apparatuses similar to that described with reference to FIG. 1, on the same substrate.

Instead of using four elementary matrices as shown in FIG. 4, that is to say, four matrices, each of which is produced from an individual substrate, it is proposed as shown in FIG. 5 for them to be produced from a single substrate 50, with the connections in respect of the rows and the columns being cut along the axes of symmetry 51 and 52 respectively. As in the embodiment described with reference to FIG. 4, the row conductors on one side of the axis 51 are connected to the addressing circuit 13' while the row conductors on the other side of the axis 51 are connected to the addressing circuit 13". Likewise, the column conductors on one side of the axis 52 are connected to the reading circuit L' while the column conductors on the other side of the axis 52 are connected to the reading circuit L".

Figure 6:
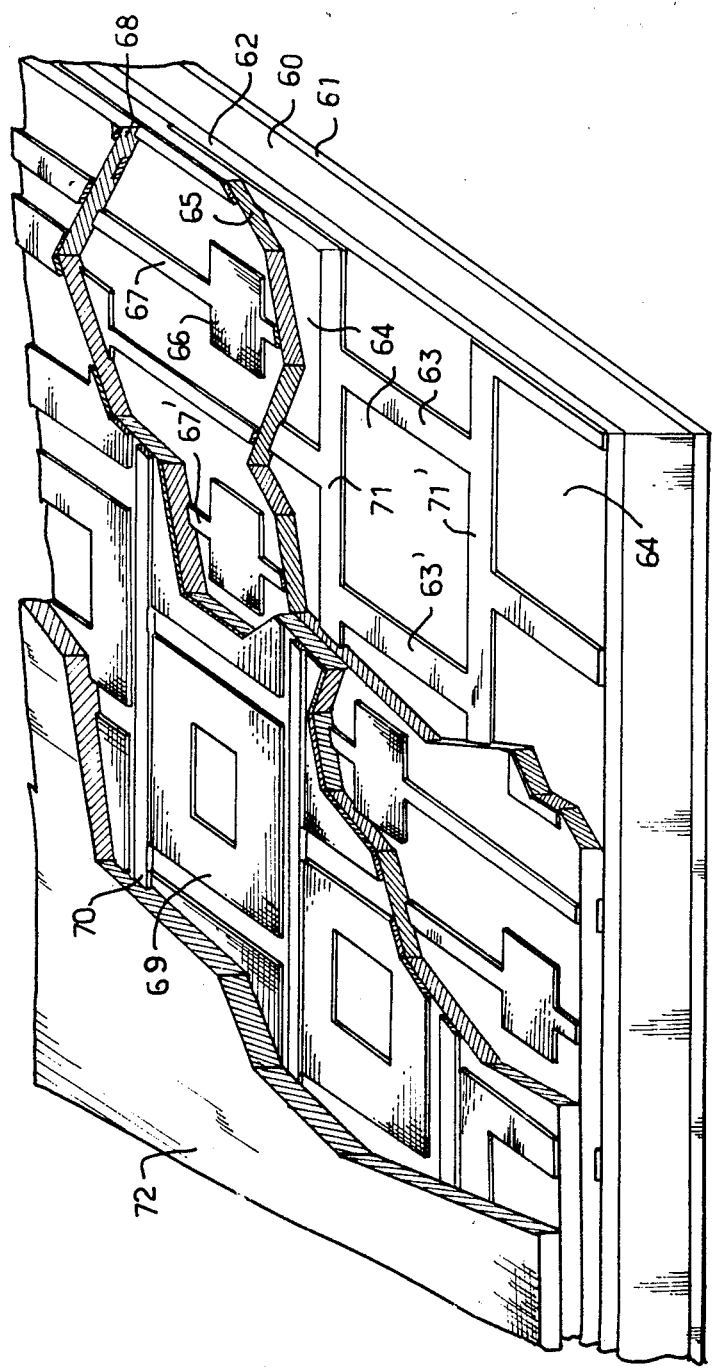
FIG. 6 is a magnified diagrammatic view, partly in cross-section and partly in perspective, of a part of a matrix of elementary cells disposed in a staggered configuration.

FIG. 6 shows another form of grouping of elementary cells according to the invention. In order to enhance understanding of the arrangement of the cells and the conductors and the manner in which they are produced, FIG. 6 is a partly sectional and partly perspective view of a part of a matrix. FIG. 6 shows that the different elementary cells are not aligned in rows and columns but are arranged in a staggered configuration, that arrangement permitting the number of rows to be doubled without increasing the number of cells connected to a reading amplifier. In order for such a matrix to be capable of operating, means must be provided in order for the signals for addressing and reading the cells disposed in rows and columns not to interfere with the charges of the other cells which are disposed in a staggered arrangement relative to the first-mentioned cells. For that purpose, in accordance with a feature of the present invention, the matrix comprises guard electrodes which are disposed below the addressing and reading conductors.

Referring to FIG. 6, the matrix comprises a semiconductor substrate 60 of type N, which is produced from indium antimonide or mercury-cadmium telluride. A metal layer 61 is deposited on one of the faces while a first insulating layer 62 is deposited on the other face. Opaque guard electrodes 63 are deposited on the insulating layer 62 and are of the shape illustrated in FIG. 6. Those electrodes define internal surfaces 64 in the form of rectangles (or squares), which correspond to elementary cells disposed in a staggered configuration. A second insulating layer 65 covers the guard electrodes 63 and the squares or rectangles 64. Transparent reading electrodes 66 and opaque reading conductors 67 of the shape shown in FIG. 6 are deposited on the second insulating layer 65. The reading electrodes 66 which are in the form of rectangles (or squares) are disposed at the centre of the rectangles (or squares) 64. It will be noted that the reading conductors 67 of a column of cells are aligned with the adjacent guard electrodes on one side in a column of cells disposed in a staggered relationship.

Thus, the reading electrodes 67 and 67' are respectively aligned with the guard electrodes 63 and 63'.

A third insulating layer 68 covers the reading electrodes 66, the reading conductors 67 and the part of the second insulating layer 65 which is not covered by the reading electrodes and the reading conductors. Transparent addressing electrodes 69 and opaque addressing conductors 70 are disposed on the third insulating layer 68, in the configuration shown in FIG. 6. Each electrode for addressing a cell is disposed around the electrode for reading the same cell, and the periphery thereof coincides with the periphery of the rectangles (or squares) 64. The electrodes for addressing a row of cells are connected together by an opaque addressing conductor such as that indicated at 70, and the addressing conductors are aligned with the limb portions of the subjacent guard electrodes, such as those indicated at 71 and 71'. A fourth insulating layer 72 covers the whole of the addressing electrodes, addressing conductors and intermediate spaces.

The materials, thicknesses and dimensions of the various elements described hereinbefore with reference to FIG. 6 are similar to those described with reference to the embodiment shown in FIG. 1. The guard electrodes, however are of chromium-gold, material are from 300 to 500 Angstroms in thickness and are about 10 microns in width.

When making use of such a staggered arrangement of elementary cells, it is possible to produce matrices comprising 128 rows and 200 columns for example, having regard to the abovementioned limitations. In such a construction, the 64 conductors of odd-number rows will be for example connected to a first addressing circuit while the corresponding 100 conductors of odd-number columns will be for example connected to a first reading circuit; in that case, the 64 conductors of even-number rows will be connected to a second addressing circuit while the corresponding 100 conductors of even-number columns will be connected to a second reading circuit. In this way, it is possible first of all to read the odd-number rows, that is to say, half a matrix, then the even-number rows, that is to say, the other half of the matrix, as in the procedure for scanning a television screen.

It will be readily appreciated that the first and second addressing circuits can be combined in a single addressing circuit comprising 128 outputs while the first and second reading circuits may be combined to form a single reading circuit comprising 200 reading amplifiers.

Figure 3:
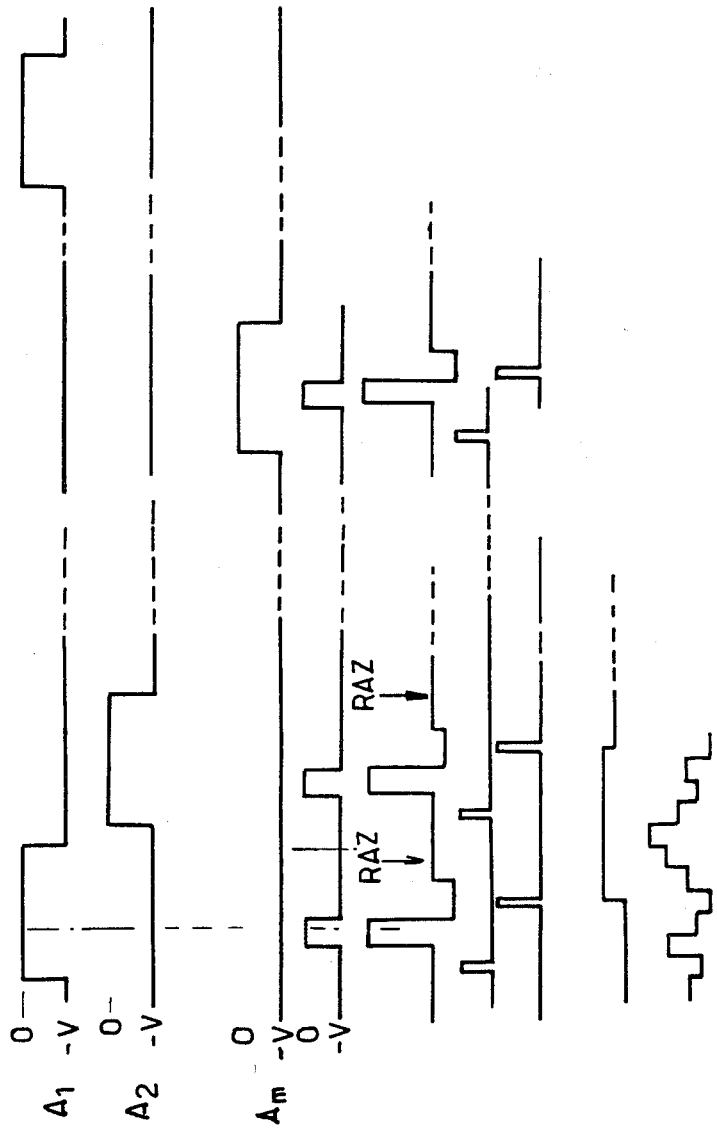
FIGS. 3a to 3i are diagrams showing addressing and reading out signals of the apparatus shown in FIG. 1.

It will also be appreciated that the above-mentioned procedure of alternately reading odd-number rows and then even-number rows may be replaced by sequential row reading, as described with reference to the particular embodiment described with reference to FIGS. 1, 2 and 3.

Finally, as described with reference to FIGS. 4 and 5, four matrices of the type described with reference to FIG. 6 can be grouped together so as to produce a matrix comprising 256 rows and 400 columns, that is to say, a matrix of television type format.

The diagrams in respect of the signals for addressing and reading a half-matrix in FIG. 6 are similar to those described with reference to FIG. 3, and will not be described in detail herein.

Figure 7:
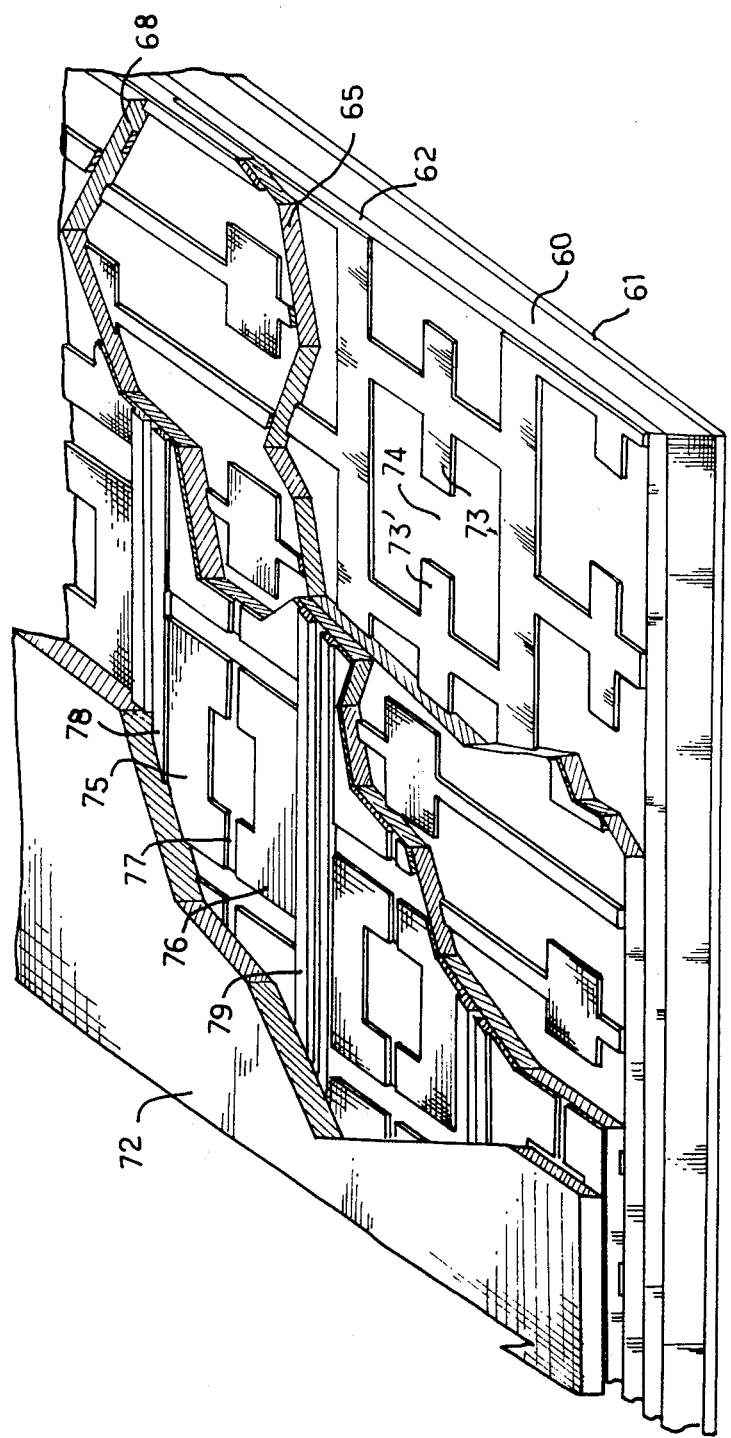
FIG. 7 is a diagrammatic view on an enlarged scale, partly in section and partly in perspective, of a part of a matrix of elementary cells disposed in a staggered configuration, each elementary cell comprising two half-cells.

FIG. 7 shows another embodiment in accordance with the present invention of a matrix similar to that shown in FIG. 6, but in wihch each elementary cell is divided into two half-cells which have the same reading electrode but two addressing electrodes which are each connected to an addressing conductor. In order to take account of the new structure of the addressing electrodes, the guard electrodes are aligned not only with the reading and addressing conductors but also with the space between the addressing electrodes of a given cell.

Referring to FIG. 7, components identical to those shown in FIG. 6 are denoted by the same references, except for the limb portions 63 and 63' of the guard electrodes, the addressing electrodes 69 and the addressing conductors 70 of FIG. 6. Thus, the limb portions 63 and 63' of the guard electrodes are in the shape of a cross as indicated at 73 and 73' in FIG. 7, the space 74 between the adjacent arms of two crosses of the same row of cells being reserved for the reading electrode 66'. Each addressing electrode 69 is divided into two equal parts 75 and 76 separated by a space 77 that is of the order of 5 microns. The addressing half-electrodes 75 of a row are connected to the same addressing conductor 78 which will be of odd number, and the addressing half-electrodes 76 are connected to the same addressing conductor 79 which will be of even number.

The dimensions and thicknesses of the different components of the matrix shown in FIG. 7 are substantially the same as those of the matrix shown in FIG. 6, except for the portions 71 and 71' of the guard electrodes, which are wider, of the order of 10-15 microns, in order to take account of the fact that they are aligned with two adjacent addressing conductors of two adjacent rows of cells in a staggered relationship. As regards the portions 73 and 73' of the guard electrodes, these are about 10 microns in width.

When using such an arrangement, it is possible for example for the conductors of odd-number rows to be connected to a first addressing circuit and for the conductors of even-number rows to be connected to a second addressing circuit. The column conductors are connected to a single reading circuit which has the same number of amplifiers as columns.

Figure 8:
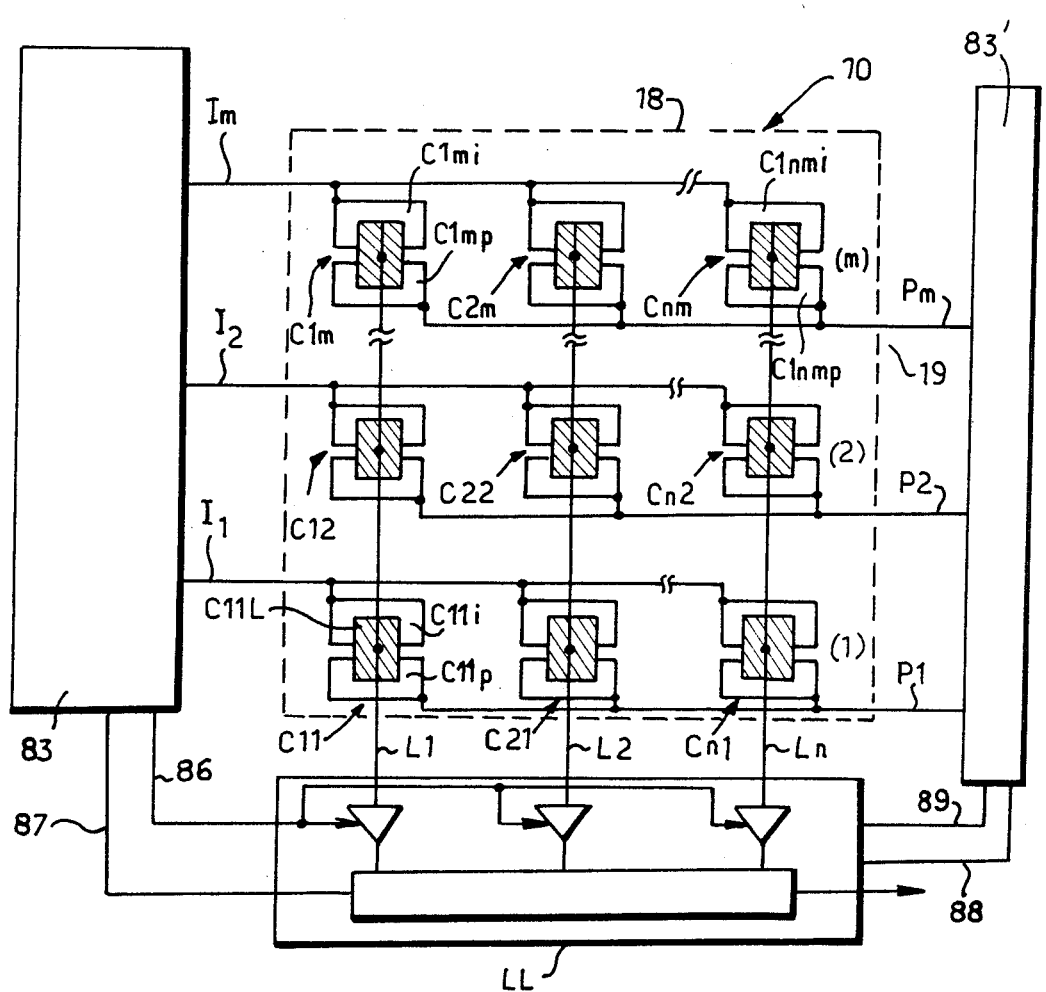
FIG. 8 is a highly simplified diagrammatic view on an enlarged scale of a recording and reading apparatus having the characteristics of the apparatus described with reference to FIG. 7, and FIGS. 9a to 9e are diagrams showing addressing and reading signals of the matrix of elementary cells as described with reference to FIGS. 7 and 8.

FIG. 8 is a diagrammatic view similar to that shown in FIG. 1, of the apparatus described with reference to FIG. 7. In FIG. 8, each elementary cell such as C11 is divided into two half-cells which comprise the same reading electrode, such as C11L, and two addressing electrodes such as C11$i$ in respect of the odd-number electrode and C11$p$ in respect of the evennumber electrode. The odd-number addressing electrodes are connected to an addressing circuit 83 by way of conductors I1 to Im while the even-number addressing electrodes are connected to an addressing circuit 83' by way of conductors P1 and Pm. The addressing circuits 83 and 83' are connected to a reading circuit LL by way of conductors 86, 87 and 88, 89, the reading circuit LL receiving the cell reading signals by way of the reading conductors L1 to Ln. In the diagrammatic view shown in FIG. 8, the other components are identical to those of the view shown in FIG. 1.

FIGS. 9a to 9d show the signals which are applied to successive row conductors of the matrix described with reference to FIGS. 7 and 8, for example the conductors I1, I2 and P1, P2 in FIG. 8, while FIG. 9e shows signals which are applied to the column conductors. When the signals are at negative potential —V, the elementary cells located below the electrodes integrate the infrared radiation received in the form of quantities of electrical charges. When the signals applied to the row conductors go to earth potential, the quantities of charges accumulated are transferred into the elementary cells under the reading electrodes. Finally, when then the signals applied to the columns go from −V to earth potential, the charges accumulated under the reading electrodes are discharged on the reading conductors, the signal read being proportional to the integration time, that is to say, the period of time for which the electrodes remained at potential −V. Thus, the half-cells in the odd row I1 are read at the moment of the pulse 80 in FIG. 9e, the half-cells of the odd row I2 are read at the moment of the pulse 81, the half-cells of the even row P1 are read at the moment of the pulse 92 and the half-cells of the even row P2 are read at the moment of the pulse 93.

Therefore, without increasing the area of the matrix, the arrangement described with reference to FIGS. 7, 8 and 9 permits the number of elementary sites to be doubled by dividing the elementary cells by two, while also making it possible to effect television type scanning. This therefore provides a matrix comprising 256 rows and 200 columns on the same substrate.

It is clear that the matrices described with reference to FIGS. 6 to 9 may be grouped in accordance with the arrangements described with reference to FIGS. 4 and 5, which permits the number of rows and columns to be doubled.

The above-described matrices are produced by the successive depositing of insulating layers which cover the entire surface of the substrate and conducting layers which cover only a part of the substrate surface, the result of which is to produce portions of increased thickness at the locations of the conducting layers, and addressing and reading electrodes which are not at the same level, as indicated above. It will be appreciated that person skilled in the art are capable of producing matrices in accordance with the invention by using known manufacturing processes so as to produce for example addressing and reading electrodes at the same level.

Matrices comprising guard electrodes were described with reference to FIGS. 6 and 7; it is possible to avoid the necessity of guard electrodes if chemical processes are used to define elementary cells in the semiconductor substrate.

I claim:

1. Apparatus for recording and reading images in the infra-red, comprising:
    a substrate of semiconductor material, of type N or P, having first and second parallel main faces on opposite sides of said substrate;
    a conducting layer covering said first main face;
    a first insulating layer covering the entire surface of said second main face;
    a plurality of first cell addressing conductor strips running parallel to each other on the surface of said first insulating layer which faces away from said second main face of said substrate;
    a plurality of first electrode areas of transparent conducting material distributed along the length of said first cell addressing conductor strips and disposed on said first insualting layer so that said first electrode areas serve also as parts of said first addressing conductor strips, said first electrode areas each being substantially wider than said strips and having a length likewise substantially greater than the width of said strips, said first electrode areas in each said conductor strip being located in staggered relation with respect to said electrode areas of a said conductor strip adjacent thereto and midway between the latter areas in the length dimension of said strips when there is one of the latter areas in both directions of said dimension;
    a second insulating layer covering at least part of said first electrode areas and also covering at least the portion of said first insulating layer not covered by said first electrode areas which is occupied by said first conductor strips;
    a plurality of second electrode areas of transparent conducting material each disposed as a layer on the second insulating layer, each second electrode area being centered thereon above one of said first electrode areas and having an aperture located above a central portion of said one of said first electrode areas, thereby constituting a cell of the apparatus in combination with the first electrode area over which the second electrode area is centered;
    a plurality of second cell addressing conducting strips running parallel to each other and perpendicular to said first cell addressing conductor strips, each connecting together a row of said second electrode areas;
    means disposed beneath said first insulating layer having a reticulated configuration defining boundaries between said cells of the apparatus, for preventing current flowing in any said first and second cell addressing conductor strips from interfering with operations of those of said cells which are adjacent to, but not connected with, the conductor strip in wich said current is flowing, and
    an amplifier connected to each of said first cell addressing conductor strips for magnifying response to illumination of any cell to which it is connected when said cell is addressed by its first and second addressing conductor strips, and
    whereby the number of cells that can be grouped on said substrate is maximized without increasing the number of cells connected to the same amplifier.

2. Apparatus according to claim 1 in which said means for preventing current flowing in a conductor strip from interfering with operations of cells not connected thereto includes a reticulated guard electrode layer of conducting material interposed between said first insulating layer and said substrate.

3. Apparatus according to claim 2, in which said reticulated guard electrode is disposed on said first insulating layer and is separated from said first electrode areas by a fourth insulating layer and is covered by said second insulating layer.

4. Apparatus according to claim 2, in which said means for preventing interference due to current flowing in said addressing conductor strips comprise insulation regions which are diffused into the semiconductor substrate and which have outlines defined by the peripheral outlines of said second electrode areas.

5. Apparatus according to claim 1, in which each of said second electrode areas has an aperture located above the central portion of the first electrode area over which it is centered and also an electrode area portion surrounding said aperture which overlaps that first electrode area over which it is centered.

6. Apparatus according to claim 5, in which said means for preventing current flowing in a conductor strip from interfering with operations of cells not connected thereto includes a reticulated guard electrode layer of conducting material interposed between said first insulating layer and said substrate.

7. Apparatus for recording and reading images in the infra-red range, comprising
- a substrate of semiconductor material, of type N or P, having first and second parallel main faces on opposite sides of said substrate;
- a conducting layer covering said first main face;
- a first insulating layer covering the entire surface of said second main face;
- a plurality of first cell addressing conductor strips running parallel to each other on the surface of said first insulating layer which faces away from said second main face of said substrate;
- a plurality of first electrode areas of transparent conducting material distributed along the lengths of said first cell addressing conductor strips and disposed on said first insulating layers so that said first electrode areas serve also as parts of said first addressing conductor strips;
- a second insulating layer covering at least part of said first electrode areas and also covering at least the portion of said first insulating layer not covered by said first electrode areas which is occupied by said first conductor strips;
- a plurality of pairs of second electrode areas of transparent conducting material disposed layerwise on said second insulating layer, each pair of said second electrode areas being a pair of facing C-shaped electrode areas centered over one of said first electrode layers and overlapping at least a substantial peripheral portion thereof, the individual pairs of electrode areas of said plurality of pairs having gaps between facing C-shaped areas identically oriented so that each C-shaped electrode area of said pair forms a half-cell of said apparatus with the same one of said first electrode areas as the other C-shaped electrode of the same pair;
- a plurality of second addressing conductor strips running parallel to each other and perpendicular to said first addressing strips, each connecting together all C-shaped electrode areas of the same row which have a first identical orientation;
- a plurality of third addressing conductor strips running parallel to each other and connecting together all C-shaped electrode areas of the same row whch have a second identical orientation opposite to said first orientation;
- means disposed beneath said first insulating layer having a reticulated configuration defining boundaries betwen said cells of the apparatus, for preventing current flowing in any said first and second cell addressing conductor strips from interfering with operations of those of said cell switch are adjacent to, but not connected with, the particular conductor strip in which said current is flowing; and
- an amplifier connected to each of said first cell addressing conductor strips for magnifying response to illumination of any cell to which it is connected when said cell is addressed by its first addressing conductor strip and a second or third addressing conductor strip,
- whereby the number of differently located cells, being in this case half cells, that is grouped on said substrate is maximized without increasing the number of cell electrodes connected to the same amplifier.

8. Apparatus according to claim 7, in which said first electrode areas have a staggered array such that said first electrode areas interposed in one of said conductor strips are located in staggered relation with respect to said first electrode areas of a said conductor strip adjacent thereto and are located midway between the latter areas in the length dimension of said strips when there is one of the latter areas in both directions of said dimension.

9. Apparatus according to claim 7, in which said means for preventing current flowing in a conductor strip from interfering with operations of cells not connected thereto includes a reticulated guard electrode layer of conducting material interposed between said first insulating layer and said substrate.

10. Apparatus according to claim 8, in which said means for preventing current flowing in a conductor strip from interfering with operations of cells not connected thereto includes a reticulated guard electrode layer of conducting material interposed between said first insulating layer and said substrate.

11. Apparatus according to claim 8, in which said means for preventing interference due to the currents flowing in said addressing conductor strips comprise a reticulated pattern of insulating regions which are diffused into the semiconductor substrate, and which have outlines defined by the peripheral outlines in said pairs of C-shaped electrode areas.

12. Apparatus according to claim 8, in which said reticulated guard electrode is disposed on said first insulating layer and is separated from said first electrode areas by a fourth insulating layer and is covered by said second insulating layer.

13. Apparatus according to claim 12, in which said reticulated guard electrode comprises longitudinal portions parallel to said third addressing conductor strip, said longitudinal portions having limb portions extending therefrom which are subjacent to the lines of separation of said C-shaped electrode pairs.

* * * * *